United States Patent
Sugiura

(10) Patent No.: US 9,123,796 B2
(45) Date of Patent: Sep. 1, 2015

(54) SEMICONDUCTOR DEVICE

(71) Applicant: KABUSHIKI KAISHA TOSHIBA, Tokyo (JP)

(72) Inventor: Masayuki Sugiura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/176,778

(22) Filed: Feb. 10, 2014

(65) Prior Publication Data

US 2014/0346601 A1  Nov. 27, 2014

(30) Foreign Application Priority Data

May 22, 2013 (JP) ................. 2013-108033

(51) Int. Cl.
*H01L 21/331* (2006.01)
*H01L 29/78* (2006.01)

(52) U.S. Cl.
CPC ...................... *H01L 29/78* (2013.01)

(58) Field of Classification Search
USPC .................. 257/141, 341, 343, 347
See application file for complete search history.

(56) References Cited

U.S. PATENT DOCUMENTS

| | | | |
|---|---|---|---|
| 3,586,930 A * | 6/1971 | Das et al. ................. | 257/401 |
| 6,563,366 B1 | 5/2003 | Kohama | |
| 6,841,828 B2 | 1/2005 | Kawanaka et al. | |
| 7,890,891 B2 | 2/2011 | Stuber et al. | |
| 8,373,231 B2 | 2/2013 | Yamamoto et al. | |
| 8,629,709 B2 | 1/2014 | Iraha et al. | |
| 2008/0079122 A1* | 4/2008 | Zhu et al. ................. | 257/635 |
| 2013/0293280 A1 | 11/2013 | Brindle et al. | |

FOREIGN PATENT DOCUMENTS

| | | |
|---|---|---|
| JP | H04105359 A | 4/1992 |
| JP | H10242470 A | 9/1998 |
| JP | H11136111 A | 6/1999 |
| JP | 2002343971 A | 11/2002 |
| JP | 2009500868 A | 1/2009 |
| JP | 2010219504 A | 9/2010 |
| JP | 2010278110 A | 12/2010 |
| JP | 2011243843 A | 12/2011 |
| JP | 2012044637 A | 3/2012 |
| JP | 2013138211 A | 7/2013 |
| JP | 2013546177 A | 12/2013 |
| WO | 2012054642 A1 | 4/2012 |

* cited by examiner

*Primary Examiner* — Tan N Tran
(74) *Attorney, Agent, or Firm* — Patterson & Sheridan, LLP

(57) ABSTRACT

A semiconductor device includes a gate electrode, source regions and drain regions, a body contact region, and a body bias control electrode. The gate electrode includes a plurality of first portions arranged in parallel with a first distance therebetween, and a second portion connecting the plurality of first portions. The source regions and the drain regions are provided between the plurality of first portions. The body contact region is disposed on the other side of the source regions and the drain regions relative to the second portion. The body bias control electrode is provided on the body contact region in parallel with the second portion at a second distance from the second portion that is greater than the first distance, and is electrically connected to the body contact region.

20 Claims, 15 Drawing Sheets

SEMICONDUCTOR DEVICE

CROSS-REFERENCE TO RELATED APPLICATION

This application is based upon and claims the benefit of priority from Japanese Patent Application No. 2013-108033, filed May 22, 2013, the entire contents of which are incorporated herein by reference.

FIELD

Embodiments described herein relate generally to semiconductor devices.

BACKGROUND

In recent years, high-frequency switch ICs for use in communications receiver circuits and transmitter circuits have undergone rapid increases in performance and functionality. Through the adoption of FETs using SOI substrates, high-frequency response performance has improved, and a large number of high-frequency switch ICs that allow a power circuit and a control circuit to be mounted on the same chip have been developed to meet the requirements of downsizing.

In a high-frequency switch IC, when input power is increased, and the voltage amplitude due to an input signal exceeds the breakdown voltage of an FET, current flows out to an FET that should be in an off state, thereby disturbing the input waveform. As a result, in the high-frequency switch circuit, harmonic distortion increases.

A technique for reducing harmonic distortion includes body bias control technology by which threshold voltage is controlled by substrate potential control. However, when the total gate width (Wg) of an FET is increased to reduce the on-resistance of a high-frequency switch IC, it is difficult to uniformly control a large body region by performing substrate potential control. As a result, partial currents concentrate and flow out, increasing the device temperature. This is a problem in that it causes the breakdown voltage of the entire high-frequency switch IC to be reduced.

DETAILED DESCRIPTION

Embodiments provide a semiconductor device capable of preventing a reduction in breakdown voltage.

According to one embodiment, a semiconductor device includes a gate electrode comprising a plurality of first portions arranged in parallel with a first distance therebetween, and a second portion connecting the plurality of first portions. The semiconductor device further includes source and drain regions provided between the plurality of first portions, and a control electrode provided in electrical contact with a body region and in parallel with the second portion at a second distance from the second portion, the second distance being greater than the first distance.

Embodiments will be described below with reference to the drawings.

First Embodiment

Figure 1:
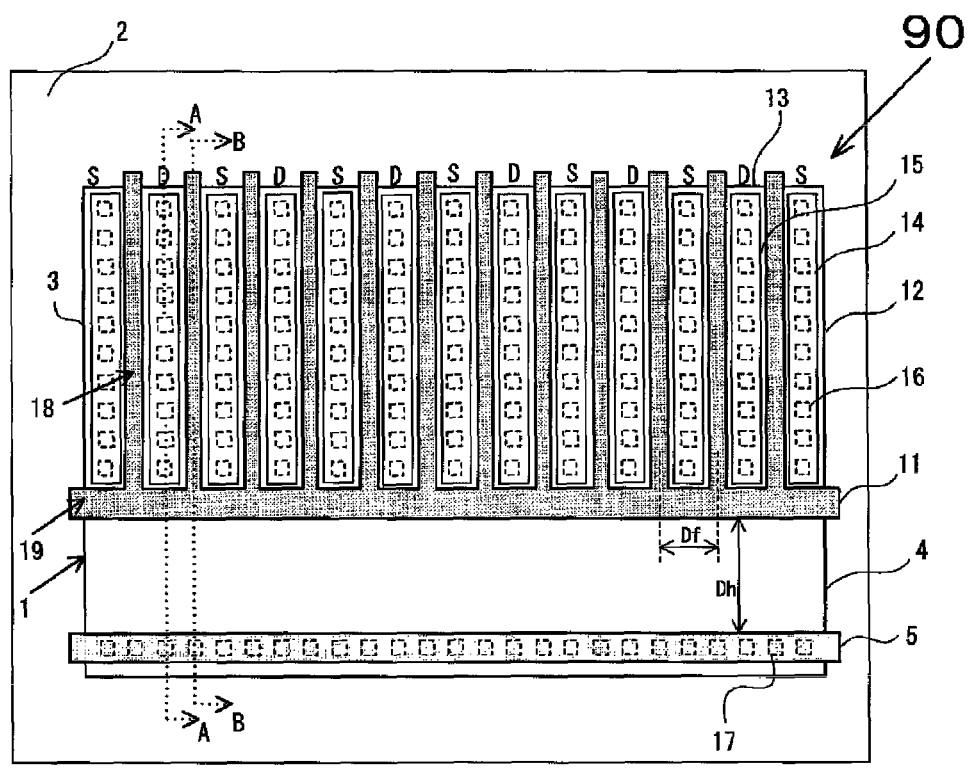
FIG. 1 is a schematic plan view showing a semiconductor device according to a first embodiment.
Figure 2:
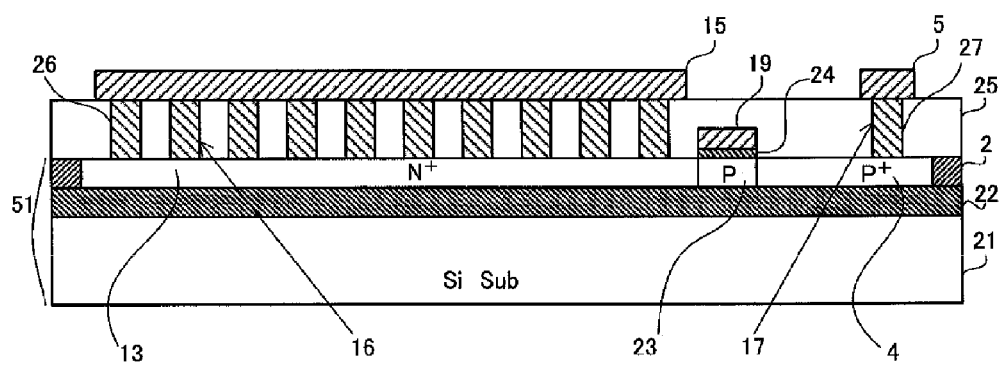
FIG. 2 is a cross-sectional view along line A-A in FIG. 1.
Figure 3:
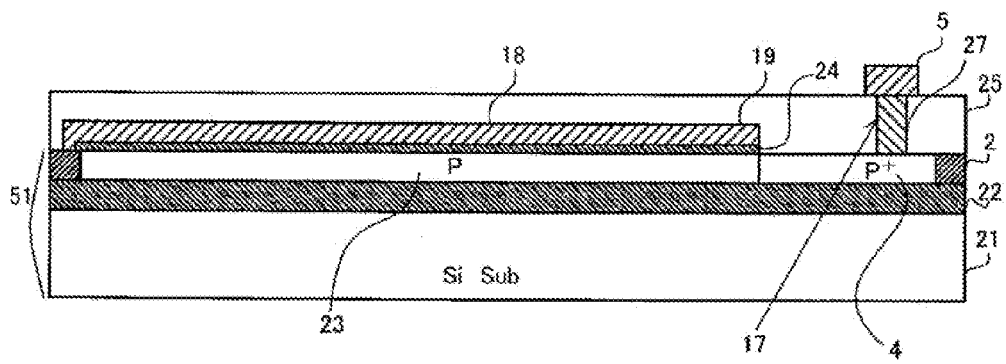
FIG. 3 is a cross-sectional view along line B-B in FIG. 1.
Figure 4:
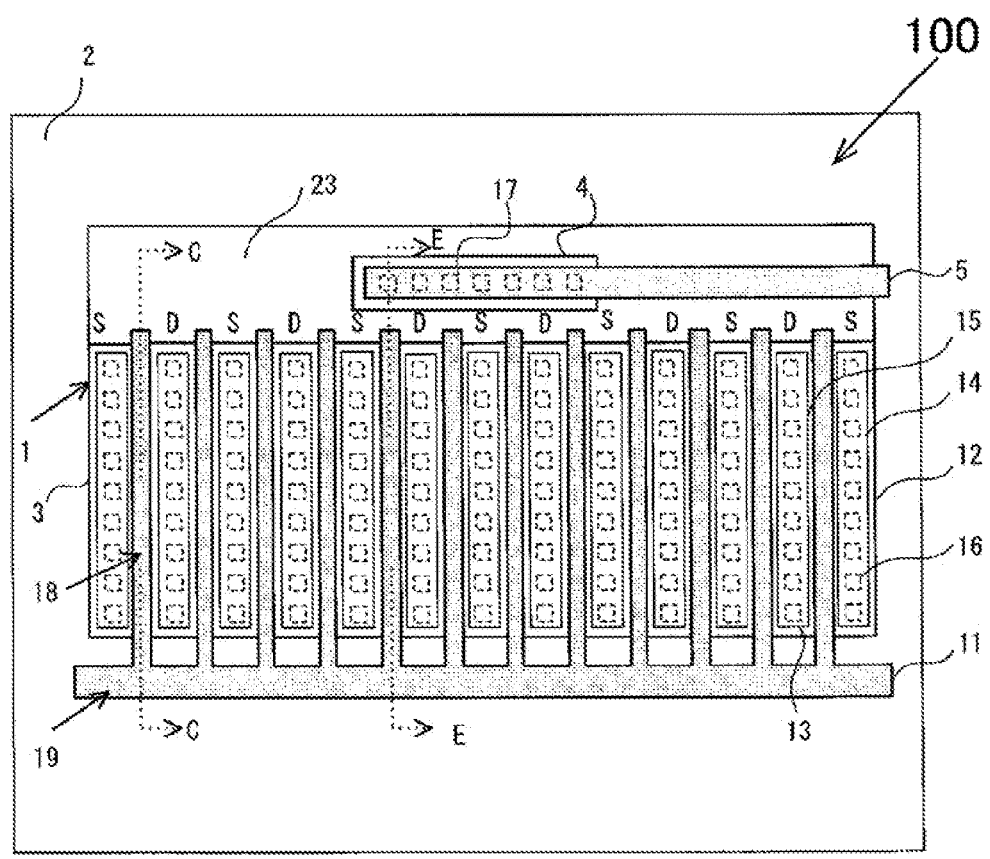
FIG. 4 is a schematic plan view showing a semiconductor device of a comparative example.
Figure 5A:
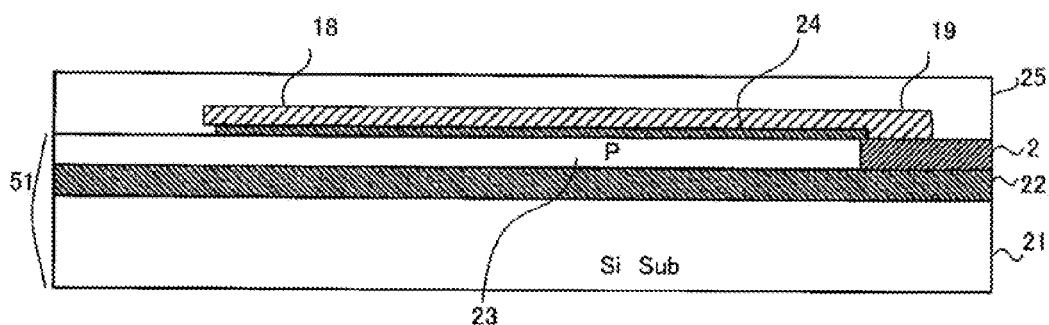
FIG. 5A is a cross-sectional view along line C-C in FIG. 4.
Figure 5B:
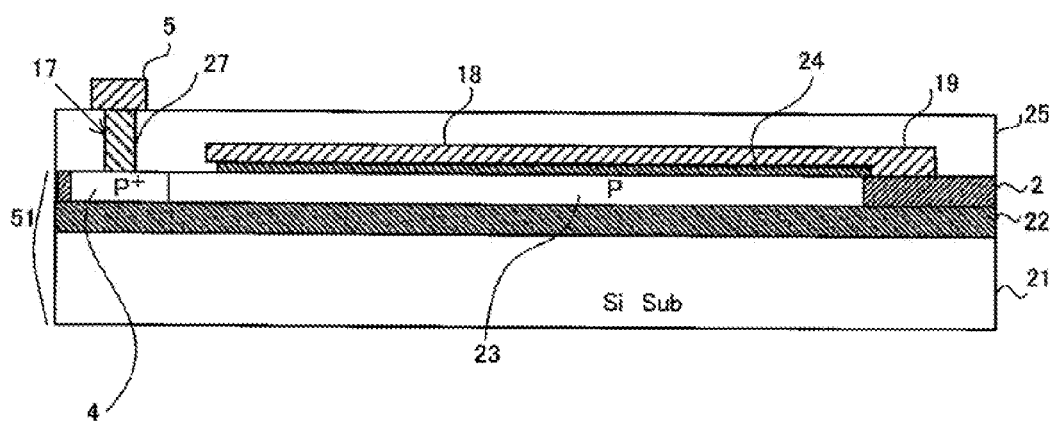
FIG. 5B is a cross-sectional view along line E-E in FIG. 4.

First, a semiconductor device according to a first embodiment will be described with reference to the drawings. FIG. 1 is a schematic plan view showing the semiconductor device. FIG. 2 is a cross-sectional view along line A-A in FIG. 1. FIG. 3 is a cross-sectional view along line B-B in FIG. 1. FIG. 4 is a schematic plan view showing a semiconductor device of a comparative example. FIG. 5A is a cross-sectional view along line C-C in FIG. 4; FIG. 5B is a cross-sectional view along line E-E in FIG. 4. In the first embodiment, a MOSFET applied to a high-frequency semiconductor switch is provided with a body contact region, and a body bias control electrode disposed in parallel with a connection of a gate electrode with a multi-finger structure, whereby breakdown voltage reduction is prevented.

As shown in FIG. 1, a high-frequency switch FET 90 as a semiconductor device is provided with a device formation region 1 having a rectangular shape isolated by a device isolation region (shallow trench isolation, STI) 2 at the periphery. The device formation region 1 includes a source-drain-gate (SDG) region 3, a body contact region 4, and a body bias control electrode 5. The high-frequency switch FET 90 is a multi-finger-type FET constituting a high-frequency switch IC.

The SDG region 3 is provided with a gate electrode 11 having a plurality of linear gate fingers 18 (first portions) arranged in parallel and a connection 19 (second portion) connecting the gate fingers 18, source regions 12 separated by the gate fingers 18 and the connection 19, and drain regions 13 separated by the gate fingers 18 and the connection 19. One end of each gate finger 18 is arranged to extend onto the device isolation region (STI) 2. The opposite ends of the connection 19 are arranged to extend onto the device isolation region (STI) 2.

The source regions 12 and the drain regions 13 are arranged alternately with the gate fingers 18 therebetween. To clarify this arrangement, the source regions 12 are denoted as S (source), and the drain regions 13 as D (drain) in the figure.

The source regions 12 are connected to source electrodes 14 through vias each embedded in one of a plurality of contact openings 16. The drain regions are connected to drain electrodes 15 through vias each embedded in one of a plurality of contact openings 16. The connection 19 is provided at a central portion of the device formation region 1 so as to divide the device formation region 1 into the SDG region 3 and the body contact region 4.

The body contact region 4 is adjacent to the connection 19, and is provided at a bottom side portion of the device formation region 1. The body bias control electrode 5 is disposed in parallel with the connection 19, and is disposed to extend onto the device isolation region (STI) 2 at the opposite ends. The body contact region 4 is connected to the body bias control electrode 5 through vias each embedded in one of a plurality of contact openings 17.

Here, the gate finger length is set at 100 μm or smaller, for example, for uniform operation. Although the number of the gate fingers is set at 12 here, the number is preferably set as appropriate depending on the magnitude of input power Pin. A lead distance Dh (second distance), which is the distance between the connection 19 and the body bias control electrode 5, is set to be the same distance at every gate finger 18.

When lead resistance is greater than connection resistance between the fingers, an increase in body potential in adjacent FETs occurs early, so that a local breakdown can be prevented. Therefore, in the embodiment, the lead distance Dh (second distance) is set longer than a finger-to-finger distance Df (first distance). Moreover, in order to substantially reduce local breakdowns, the lead distance Dh is preferably set to be two or more times the finger-to-finger distance Df, for example.

As shown in FIG. 2, the high-frequency switch FET 90 is a fully-depleted N-channel metal-oxide-semiconductor field-effect transistor (MOSFET) formed using an SOI substrate 51 that includes a silicon substrate 21, a BOX layer (buried oxide film) 22, and a body region 23.

The drain region 13, which is an N$^+$ layer, the body region 23, which is a P layer, and the body contact region 4, which is a P$^+$ layer, are encircled at the periphery by the device isolation region (STI) 2 formed on the BOX layer (buried oxide film) 22. The drain regions 13 are of a conductivity type opposite to that of the body region 23, and have a dopant concentration set higher than that of the body region 23. The body contact region 4 is of the same conductivity type as the body region 23 is, and has a dopant concentration set higher than that of the body region 23.

The plurality of contact openings 16 are formed in an insulating film 25 on the drain regions 13, and vias 26 are embedded in the contact openings 16. The drain electrodes 15 are connected to the drain regions 13 through the plurality of vias 26. On the body region 23, the gate insulating film 24 and the connection 19 of the gate electrode 11 are formed in layers. The plurality of contact openings 17 are formed in the insulating film 25 on the body contact region 4, and vias 27 are embedded in the contact openings 17. The body bias control electrode 5 is connected to the body contact region 4 through the plurality of vias 27.

As shown in FIG. 3, in the high-frequency switch FET 90, the gate insulating film 24 and the gate fingers 18 of the gate electrode 11, and the gate insulating film 24 and the connection 19 of the gate electrode 11 are formed in layers on the body region 23.

With the structure shown in FIGS. 1 to 3 in which the lead distance Dh is set to be longer than the finger-to-finger distance Df, when the body potential locally increases in the high-frequency switch FET 90, the increase in the body potential quickly propagates to adjacent FETs rather than to a control terminal due to the resistance of the lead region (body contact region 4). The increase in body potential has an effect on the adjacent FETs, varying the threshold voltages (Vth) of the FETs over a large area. This does not result in a breakdown that is caused by a local breakdown voltage reduction, but the effect thereof can be limited to a small current inflow over a large area. The quick propagation of the Vth variations over a large area greatly reduces local temperature increase and allows the multi-finger-type high-frequency switch FET 90 with a large gate length (Wg) to maintain a high breakdown voltage.

As shown in FIG. 4, in a high-frequency switch FET 100 of a comparative example as a semiconductor device, the device formation region 1 includes the SDG region 3, the body region 23, the body contact region 4, and the body bias control electrode 5. The high-frequency switch FET 100 is a multi-finger-type FET constituting a portion of a high-frequency switch IC.

The SDG region 3 is provided with a plurality of gate fingers 18 of the gate electrode 11 arranged in parallel, the source regions 12 (denoted as S in the figure) separated by the gate fingers 18, and the drain regions 13 (denoted as D in the figure) separated by the gate fingers 18. The connection 19 of the gate electrode 11 connects the plurality of gate fingers 18, and is provided on a device isolation region (STI) 2 apart from the SDG region 3.

The body region 23 is adjacent to the source regions 12, the drain regions 13, and the gate fingers 18, and is provided at an upper portion of the device formation region 1. The body contact region 4 is disposed at a central portion of the body region 23 on an opposite side of the connection 19 of the gate electrode 11 relative to the gate fingers 18. The body contact region 4 is set to have a smaller width than the connection 19 of the gate electrode 11.

The body bias control electrode 5 is connected to the body contact region 4 through the vias 27 each embedded in one of the plurality of contact openings 17. In the high-frequency switch FET 100 in the comparative example, the number of the contact openings 17 is smaller than that in the high-frequency switch FET 90 in the embodiment. Specifically, the number of the contact openings 17 in the high-frequency switch FET 100 in the comparative example is 7, while the number of the contact openings 17 in the high-frequency switch FET 90 in the embodiment is 25.

As shown in FIG. 5A, at an end portion of the gate finger 18, the gate insulating film 24 and the gate finger 18 of the gate electrode 11 are formed in layers on the body region 23. In the body region 23 on the left in the figure, the body contact region 4 is not provided.

As shown in FIG. 5B, at a central portion of the gate finger 18, the gate insulating film 24 and the gate finger 18 of the gate electrode 11 are formed in layers on the body region 23. In the body region 23 on the left in the figure, the body contact region 4, the contact opening 17, the via 27, and the body bias control electrode 5 are provided. The body bias control electrode 5 is connected to the body contact region 4 through the via 27.

In the high-frequency switch FET 100 of the comparative example, the distance between the gate fingers 18 and the body bias control electrode 5 is set at different distances, depending on the locations of the gate fingers 18. In other words, the body contact region 4 is not equidistantly disposed with respect to the plurality of gate fingers 18. Moreover, the lead distance is not set to be longer than the finger-to-finger distance at the central portion, and is set to be longer than the finger-to-finger distance at the end portion. Consequently, a breakdown occurring locally ultimately leads to a breakdown accompanied by a large current due to a local temperature increase and a reduction in Vth caused by the temperature increase.

Figure 6:
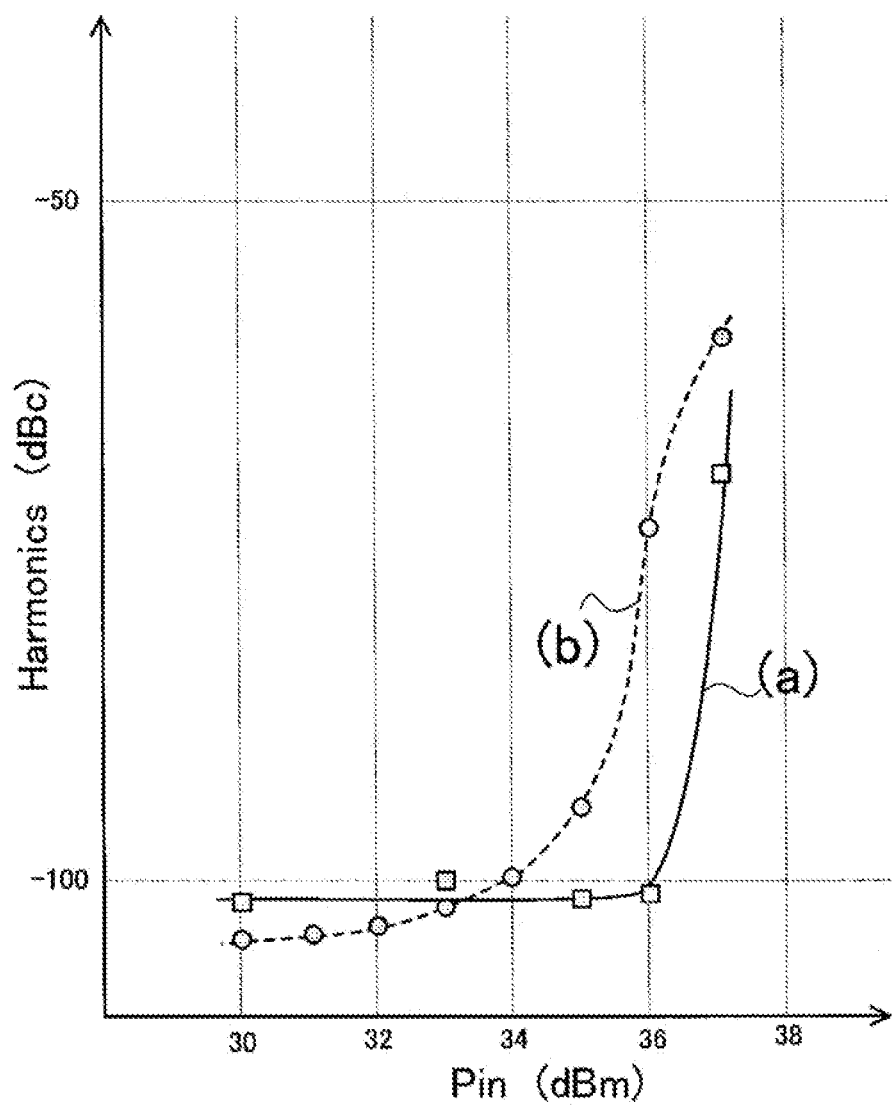
FIG. 6 is a graph showing the relationship between input power and second harmonic distortion according to the first embodiment.
Figure 7:
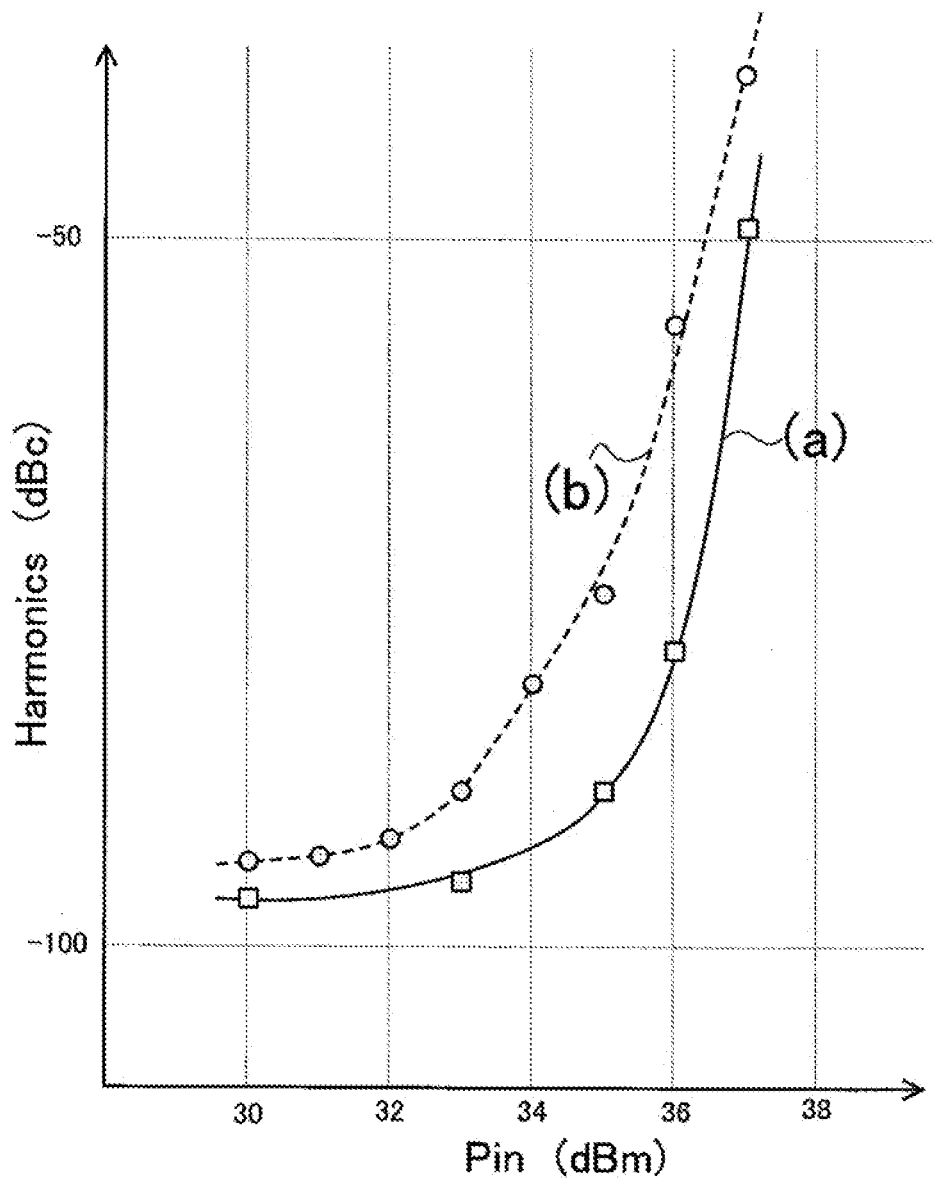
FIG. 7 is a graph showing the relationship between input power and third harmonic distortion according to the first embodiment.

Next, harmonic distortion in the high-frequency switch ICs will be described with reference to the drawings. FIG. 6 is a graph showing the relationship between input power (Pin) and second harmonic distortion (2nd Harmonics). FIG. 7 is a graph showing the relationship between input power (Pin) and third harmonic distortion (3rd Harmonics). In FIGS. 6 and 7, solid lines (a) show performances of the embodiment, and dashed lines (b) show performances of the comparative example.

Here, the power voltage (Vdd) is set at 3 V, the input frequency (fin) at 1.9 GHz, the total gate length (Wg) of the high-frequency switch IC at 4 mm, and the lead distance Dh/finger-to-finger distance Df at 2.5 in the embodiment.

As shown in FIG. 6, in the comparative example (dashed line (b)), when Pin increases to 34 dBm or greater, second harmonic distortion sharply increases. Compared to this, in the embodiment (solid line (a)), until Pin reaches 36 dBm, second harmonic distortion does not increase, and when Pin becomes greater than 36 dBm, second harmonic distortion increases. That is, in the embodiment, second harmonic distortion can be significantly reduced as compared to the comparative example. Specifically, when Pin is 36 dBm, second harmonic distortion can be reduced by 30 dB from that in the comparative example. It is considered that second harmonic distortion is mainly caused by a non-linear component of the on-resistance of the turned-on FET.

As shown in FIG. 7, in the comparative example (dashed line (b)), when Pin increases to 32 dBm or greater, third harmonic distortion sharply increases. Compared to this, in the embodiment (solid line (a)), until Pin reaches 34 dBm, increase in third harmonic distortion is limited, and when Pin becomes greater than 34 dBm, third harmonic distortion increases. That is, in the embodiment, third harmonic distortion can be significantly reduced as compared to the comparative example. Specifically, when Pin is 34 dBm, third harmonic distortion can be reduced by 12 dB from that in the comparative example, and when Pin is 36 dBm, third harmonic distortion can be reduced by 25 dB from that in the comparative example. It is considered that third harmonic distortion is mainly caused by a non-linear component of the off-capacitance of the turned-off FET.

As described above, the high-frequency switch FET 90 in the embodiment is a multi-finger-type FET, and is provided with the device formation region 1 isolated at the periphery by the device isolation region (STI) 2. The device formation region 1 includes the SDG region 3, the body contact region 4, and the body bias control electrode 5. The connection 19 is provided at a central portion of the device formation region 1 so as to separate the SDG region 3 from the body contact region 4. The connection 19 connects the plurality of gate fingers 18 arranged in parallel. The body bias control electrode 5 connected to the body contact region 4 is disposed in parallel with the connection 19. The lead distance Dh, which is the distance between the connection 19 and the body bias control electrode 5, is set to be greater than the finger-to-finger distance Df.

Therefore, increases in body potential in adjacent FETs occur earlier than before, so that a local breakdown can be prevented, and a local temperature increase can be reduced. Thus, the breakdown voltage of the entire high-frequency switch FET 90 can be kept high. Moreover, harmonic distortion can be significantly reduced.

Figure 8:
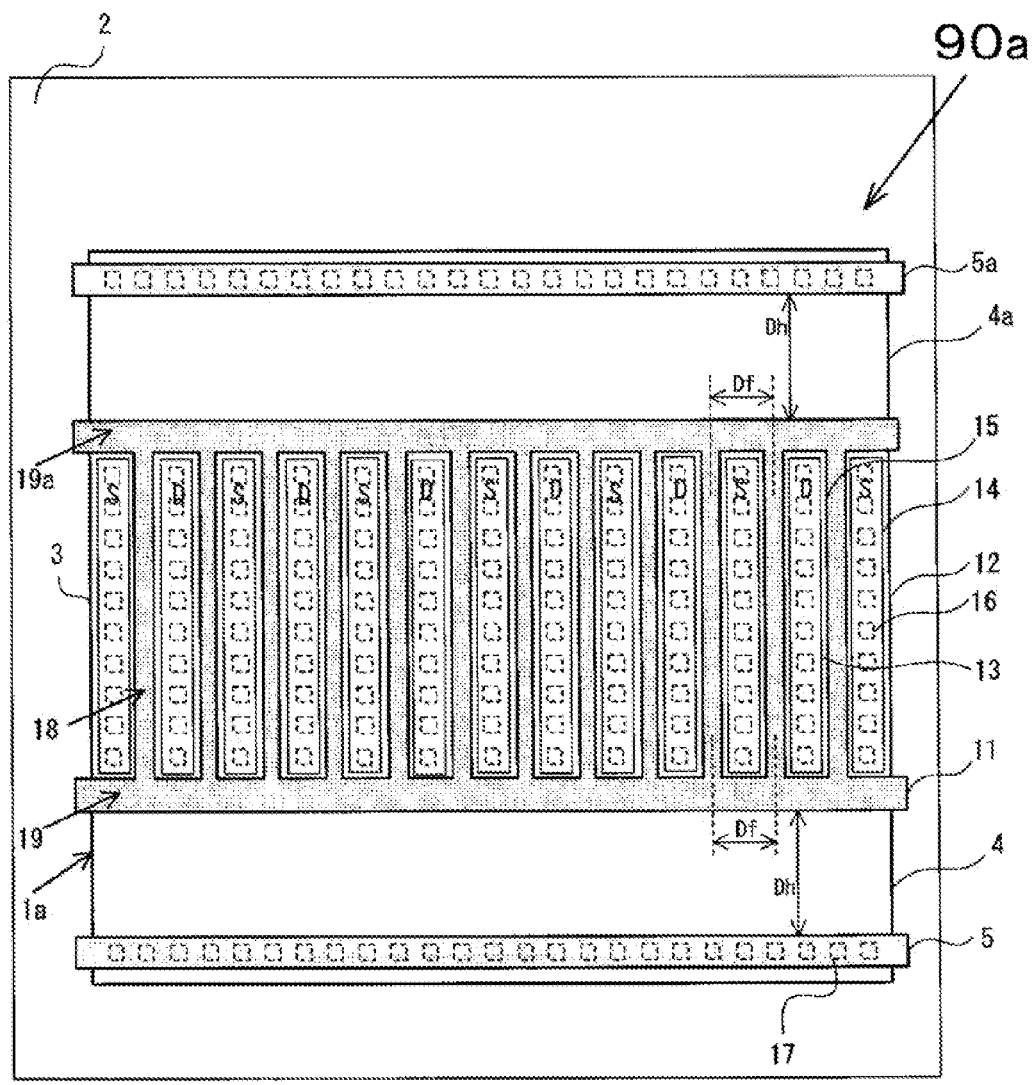
FIG. 8 is a schematic plan view showing a semiconductor device according to a first modification.

Although in the high-frequency switch FET 90 in the embodiment, the connection 19 is provided at one end of the gate fingers 18, it is not necessarily limited to this. For example, as in a high-frequency switch FET 90a according to a first modification shown in FIG. 8, connections may be provided at both ends of gate fingers 18. Specifically, a device formation region 1a includes the SDG region 3, the body contact region 4, a body contact region 4a, the body bias control electrode 5, and a body bias control electrode 5a.

The SDG region 3 is provided with the gate electrode 11 including the plurality of gate fingers 18 arranged in parallel and connections 19 and 19a connecting the gate fingers 18, the source regions 12 separated by the gate fingers 18 and the connections 19 and 19a, and the drain regions 13 separated by the gate fingers 18 and the connections 19 and 19a. The connection 19 is provided at one end of the gate fingers 18, and the connection 19a is provided at the other end of the gate fingers 18. The body bias control electrode 5a connected to the body contact region 4a is disposed in parallel with the connection 19a. The lead distance Dh as the distance between the connection 19a and the body bias control electrode 5a is set longer than the finger-to-finger distance Df.

The high-frequency switch FET 90a according to the first modification is provided with the body bias control electrode 5 and the body bias control electrode 5a, so that it is able to reduce a local temperature increase by a greater amount than the high-frequency switch FET 90 according to the embodiment.

Second Embodiment

Figure 9:
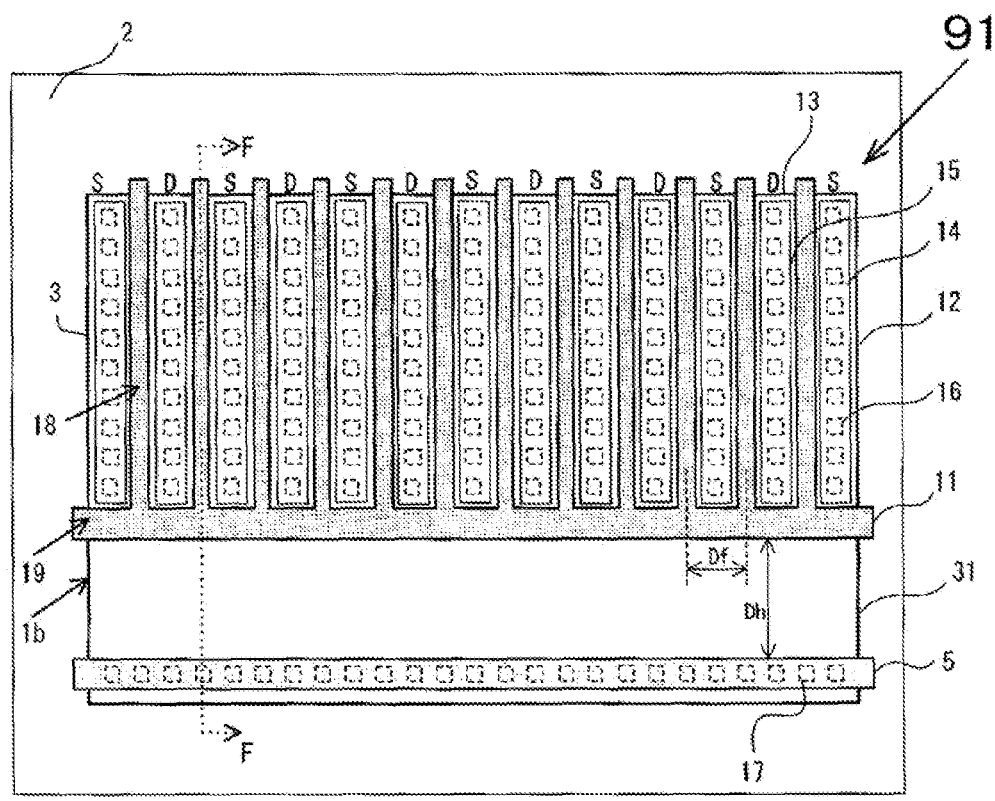
FIG. 9 is a schematic plan view showing a semiconductor device according to a second embodiment.
Figure 10:
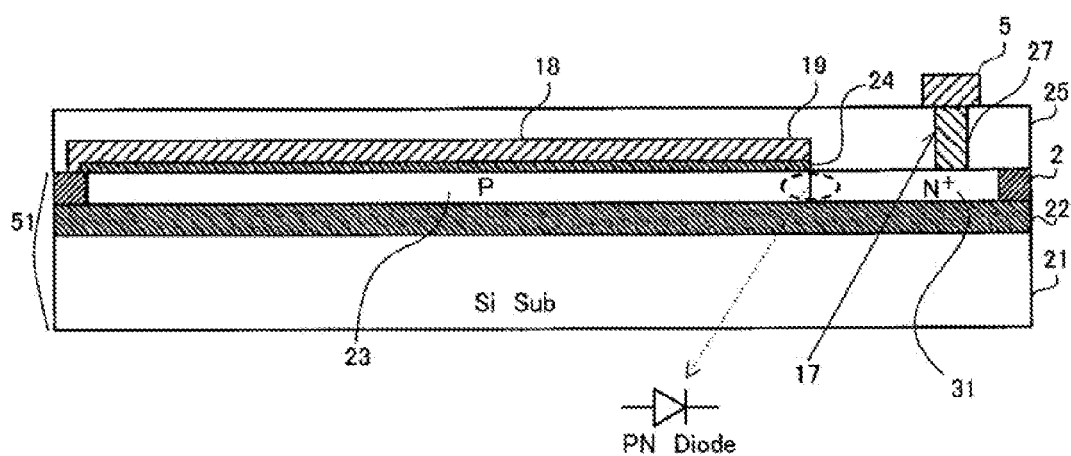
FIG. 10 is a cross-sectional view along line F-F in FIG. 9.

Next, a semiconductor device according to a second embodiment will be described with reference to the drawings. FIG. 9 is a schematic plan view showing the semiconductor device. FIG. 10 is a cross-sectional view along line F-F in FIG. 9. In this embodiment, a body contact region is of a conductivity type different from that of a body region, and the body region and the body contact region constitute a PN diode.

Hereinafter, the same components as those in the first embodiment are denoted by the same reference numerals and will not be described. Only different portions will be described.

As shown in FIG. 9, a high-frequency switch FET 91 as a semiconductor device is provided with a device formation region 1b with a rectangular shape isolated by the device isolation region (STI) 2 at the periphery. The device formation region 1b includes the SDG region 3, a body contact region 31, and the body bias control electrode 5. The high-frequency switch FET 91 is a multi-finger-type FET constituting a portion of a high-frequency switch IC.

The body bias control electrode 5 is connected to the body contact region 31 through vias each embedded in one of the plurality of contact openings 17. The lead distance Dh, which is the distance between the connection 19 and the body bias control electrode 5, is set to be longer than the finger-to-finger distance Df.

As shown in FIG. 10, in the high-frequency switch FET 91, a gate insulating film 24 and the gate fingers 18 of the gate electrode 11, and the gate insulating film 24 and the connection 19 of the gate electrode 11 are formed in layers on the body region 23. As shown in the right end portion of the figure, the body bias control electrode 5 is provided on the body contact region 31 that abuts the body region 23. The body bias control electrode 5 is connected to the body contact region 31 through the vias 27 embedded in the contact openings 17.

The body contact region 31 is of a conductivity type opposite to that of the body region 23, and is set higher in dopant concentration than the body region 23. Here, the body region 23 is a P layer, and the body contact region 31 is an $N^+$ layer. The body region 23 and the body contact region 31 constitute a $PN^+$ diode.

The body contact region 31 is an $N^+$ layer like source regions 12 and drain regions 13, thus eliminating the need to form the body contact region 4 ($P^+$ layer) as in the first embodiment. Thus the number of processes can be reduced from that in the first embodiment.

When the body region 23 and the body contact region 31 constitute a $PN^+$ diode, it is necessary to apply a voltage lower than that in the first embodiment by the value of an on-voltage in order to control the body potential. Therefore, a voltage applied to the gate electrode 11 is also preferably applied to the body bias control electrode 5.

When the same voltage is applied to the gate electrode 11 and the body bias control electrode 5 (that is, the gate electrode 11 and the body bias control electrode 5 are electrically connected), the body bias control electrode 5 is biased at a positive voltage, so that the $PN^+$ diode is reverse-biased.

As described above, the high-frequency switch FET 91 according to the embodiment is provided with the device formation region 1b isolated by the device isolation region (STI) 2 at the periphery. The device formation region 1b includes the SDG region 3, the body contact region 31, and the body bias control electrode 5. The body region 23 and the body contact region 31 constitute a $PN^+$ diode. The gate electrode 11 and the body bias control electrode 5 are electrically connected.

Therefore, since the body bias control electrode 5 is biased at a positive voltage, the $PN^+$ diode is reverse-biased, thus an effect on an external circuit is automatically avoided. As a result, the circuit configuration of the high-frequency switch IC can be simplified further than in the first embodiment. Moreover, formation of a $P^-$ layer becomes unnecessary, and the number of processes can be reduced.

Third Embodiment

Figure 11:
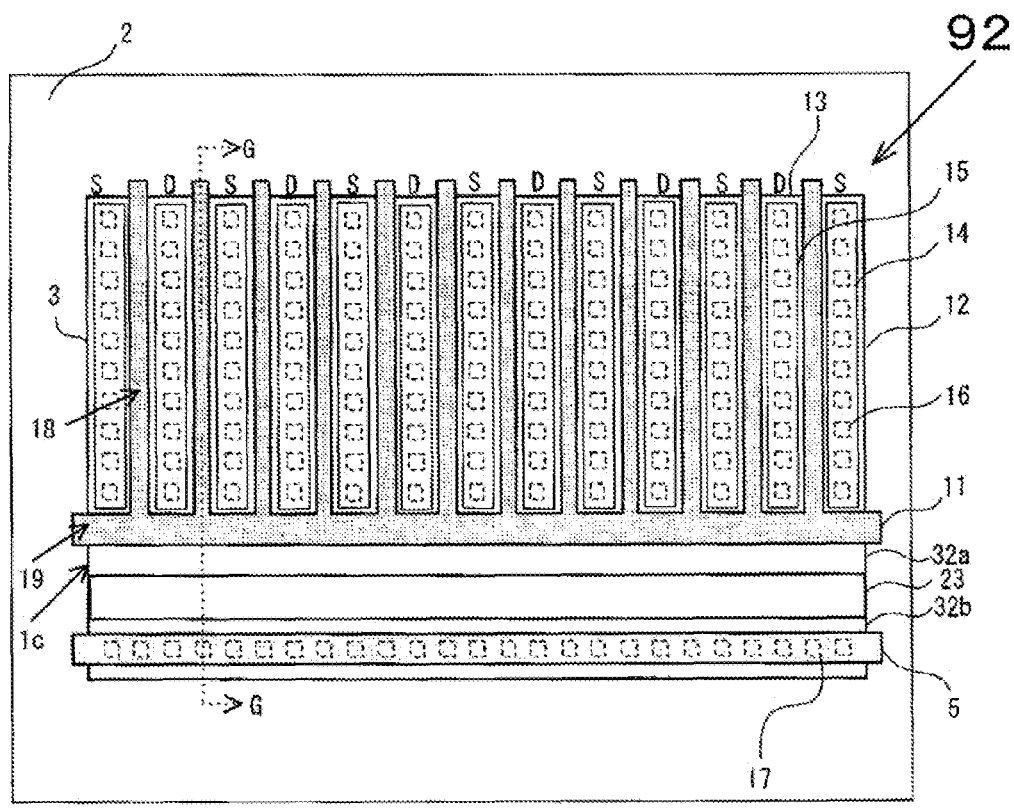
FIG. 11 is a schematic plan view showing a semiconductor device according to a third embodiment.
Figure 12:
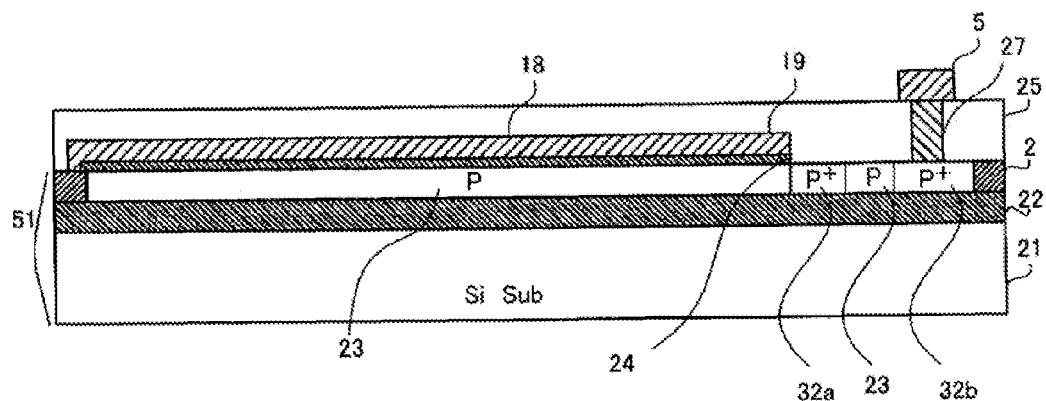
FIG. 12 is a cross-sectional view along line G-G in FIG. 11.

Next, a semiconductor device according to a third embodiment will be described with reference to the drawings. FIG. 11 is a schematic plan view showing the semiconductor device. FIG. 12 is a cross-sectional view along line G-G in FIG. 11. In this embodiment, a body contact region is divided into two portions by a body region.

Hereinafter, the same components as those in the first embodiment are denoted by the same reference numerals and will not be described. Only different portions will be described.

As shown in FIG. 11, a high-frequency switch FET 92 as a semiconductor device is provided with a device formation region 1c with a rectangular shape isolated by the device isolation region (STI) 2 at the periphery. The device formation region 1c includes the SDG region 3, a body contact region 32a, a body contact region 32b, the body region 23, and the body bias control electrode 5. The high-frequency switch FET 92 is a multi-finger-type FET constituting a portion of a high-frequency switch IC.

The body region 23 divides the body contact region into the body contact region 32a (first body contact region) and the body contact region 32b (second body contact region). The body contact region 32a, the body region 23, and the body contact region 32b are disposed in parallel with the connection 19 of the gate electrode 11.

The body contact region 32a is adjacent to the connection 19 of the gate electrode 11 along one long side, abuts the body region 23 along the other long side, and is disposed at an upper side portion of the device formation region 1c. The body contact region 32b abuts the body region 23 along one long side, abuts the device isolation region (STI) 2 along the other long side, and is disposed at a lower side portion of the device formation region 1c.

The body bias control electrode 5 is provided on the body contact region 32b. The body bias control electrode 5 is connected to the body contact region 32b through the vias 27 each embedded in one of the plurality of contact openings 17.

As shown in FIG. 12, in the high-frequency switch FET 92, the gate insulating film 24 and the gate fingers 18 of the gate electrode 11, and the gate insulating film 24 and the connection 19 of the gate electrode 11 are formed in layers on the body region 23. As shown at a right end portion in the figure, the body contact region 32a abutting the body region 23 immediately below the gate is provided on the BOX layer (buried oxide film) 22. On the BOX layer (buried oxide film) 22, the body contact region 32b is provided.

The body region 23 is provided between the body contact region 32a and the body contact region 32b. The body contact region 32a and the body contact region 32b are of the same conductivity type as the body region 23 is, and are set higher in dopant concentration than the body region 23. The body bias control electrode 5 is connected to the body contact region 32b through the vias 27.

In the embodiment, the body region 23 with a low dopant concentration is provided between the body contact region 32a and the body contact region 32b. Therefore, propagation of body potential to adjacent FETs can be faster than in the first embodiment.

As described above, the high-frequency switch FET 92 according to the embodiment is provided with the device formation region 1c isolated by the device isolation region (STI) 2 at the periphery. The device formation region 1c includes the SDG region 3, the body contact region 32a, the body contact region 32b, the body region 23, and the body bias control electrode 5. The body region 23 with a low dopant concentration is provided between the body contact region 32a and the body contact region 32b.

Therefore, the transfer speed of a charge to a number of FETs as well as to adjacent FETs can be increased, a voltage increase in the high-frequency switch FET 92 can be further reduced, and the breakdown voltage of the entire high-frequency switch FET 92 can be kept high. Moreover, the lead distance Dh can be shorter than in the first embodiment.

Figure 13:
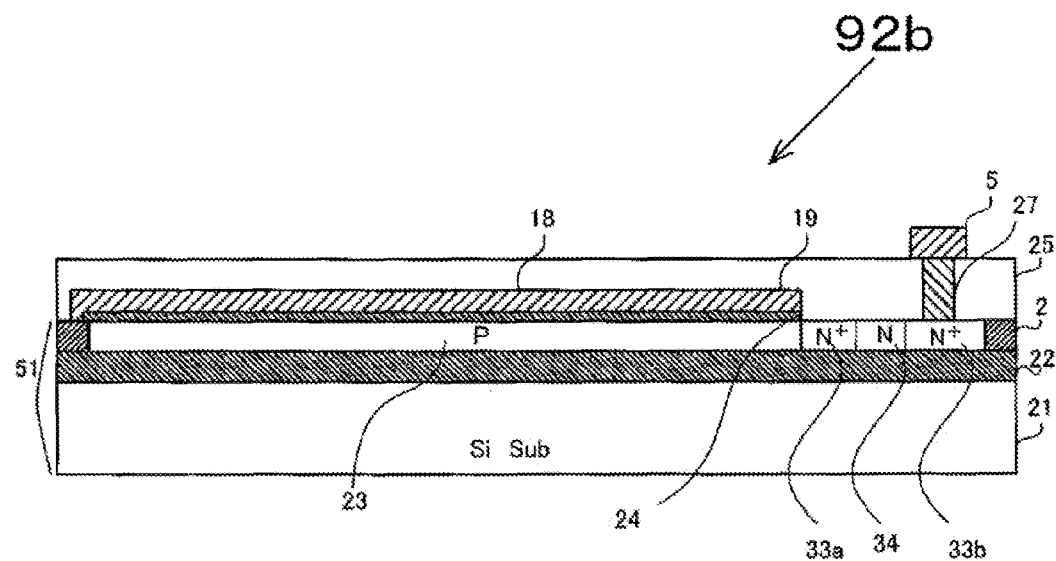
FIG. 13 is a schematic plan view showing a semiconductor device according to a second modification.

Although in the embodiment, the body contact region 32a and the body contact region 32b made of $p^+$ layers are provided, the embodiment is not necessarily limited to this. For example, as in a high-frequency switch FET 92b according to a second modification shown in FIG. 13, a body contact region 33a and a body contact region 33b made of $N^+$ layers and divided by an N layer 34 may be provided.

Alternatively, an entire portion including the body contact region 32a, the body region 23, and the body contact region 32b may be a $P^+$ layer, and the surfaces of the body contact region on the connection 19 side and the body contact region on the body bias control electrode 5 side may be changed to silicide to have a low resistance.

Fourth Embodiment

Figure 14:
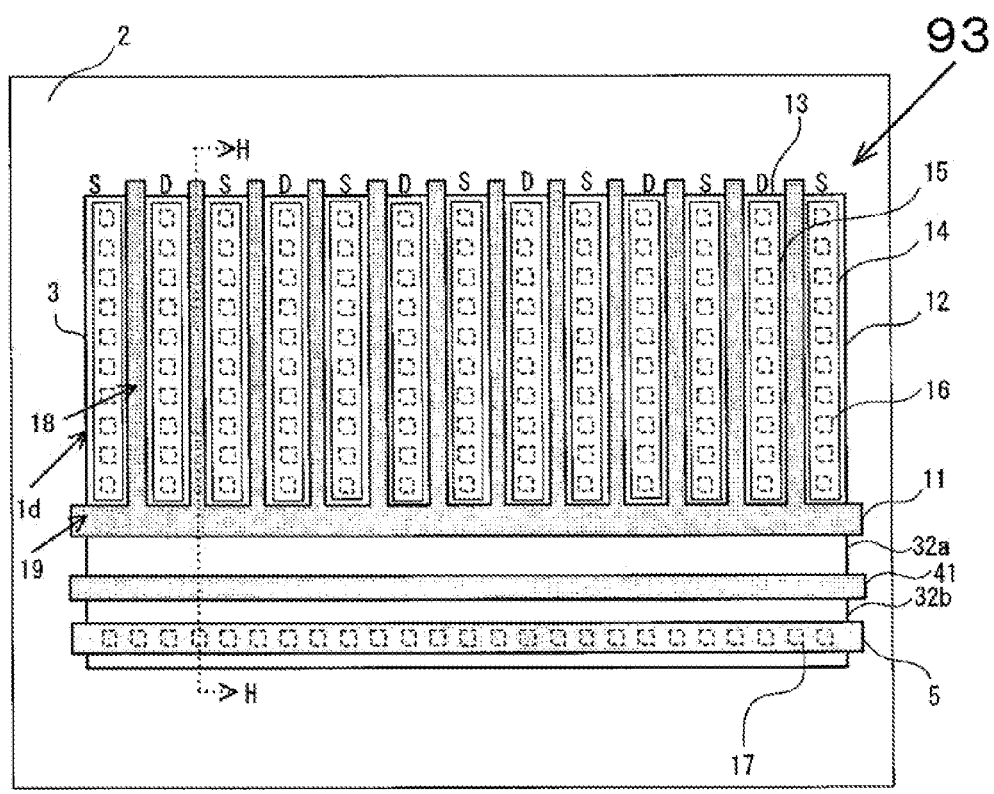
FIG. 14 is a schematic plan view showing a semiconductor device according to a fourth embodiment.
Figure 15:
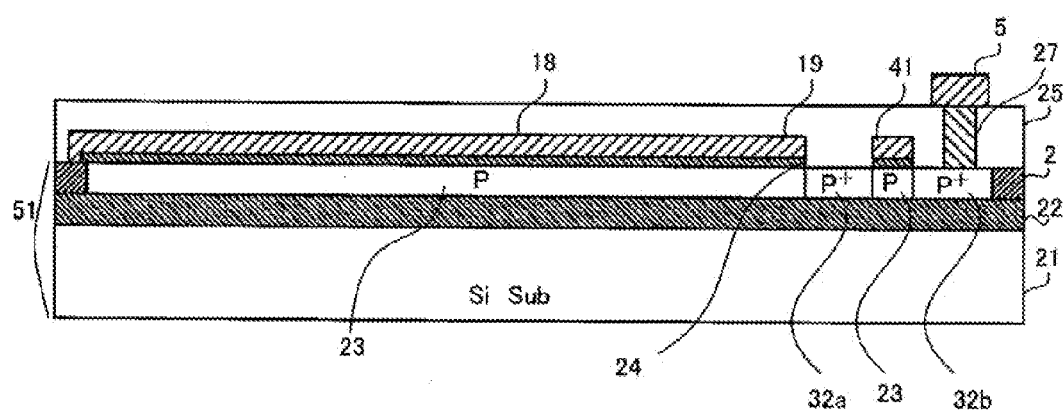
FIG. 15 is a cross-sectional view along line H-H in FIG. 14.

Next, a semiconductor device according to a fourth embodiment will be described with reference to the drawings. FIG. 14 is a schematic plan view showing the semiconductor device. FIG. 15 is a cross-sectional view along line H-H in FIG. 14. In this embodiment, a body contact region is divided into two portions by a body region, and a gate insulating film and a lead resistance control electrode are formed in layers on the body region.

Hereinafter, the same components as those in the third embodiment are denoted by the same reference numerals and will not be described. Only different portions will be described.

As shown in FIG. 14, a high-frequency switch FET 93 as a semiconductor device is provided with a device formation region 1d with a rectangular shape isolated by the device isolation region (STI) 2 at the periphery. The device formation region 1d includes the SDG region 3, the body contact region 32a, the body contact region 32b, a lead resistance control electrode 41 (first control electrode), and the body bias control electrode 5. The high-frequency switch FET 93 is a multi-finger-type FET constituting a portion of a high-frequency switch IC. The lead resistance control electrode 41 (first control electrode) divides the body contact region into the body contact region 32a and the body contact region 32b.

As shown in FIG. 15, in the high-frequency switch FET 93, the gate insulating film 24 and the gate fingers 18 of the gate electrode 11, and the gate insulating film 24 and the connection 19 of the gate electrode 11 are formed in layers on the body region 23. As shown at a right end portion in the figure, the body contact region 32a abutting the body region 23 immediately below the gate is provided on the BOX layer (buried oxide film) 22. On the BOX layer (buried oxide film) 22, the body contact region 32b is provided. The gate insulating film 24 and the lead resistance control electrode 41 are formed in layers on the body region 23 between the body contact region 32a and the body contact region 32b.

Although in the embodiment, the lead resistance control electrode 41 may be fixed to ground potential, it may alternatively be supplied with gate voltage. In this case, the body contact region 32a, the body region 23, the body contact region 32b, the gate insulating film 24, and the lead resistance control electrode 41 constitute a normally-on type P-channel MOSFET structure.

Figure 16:
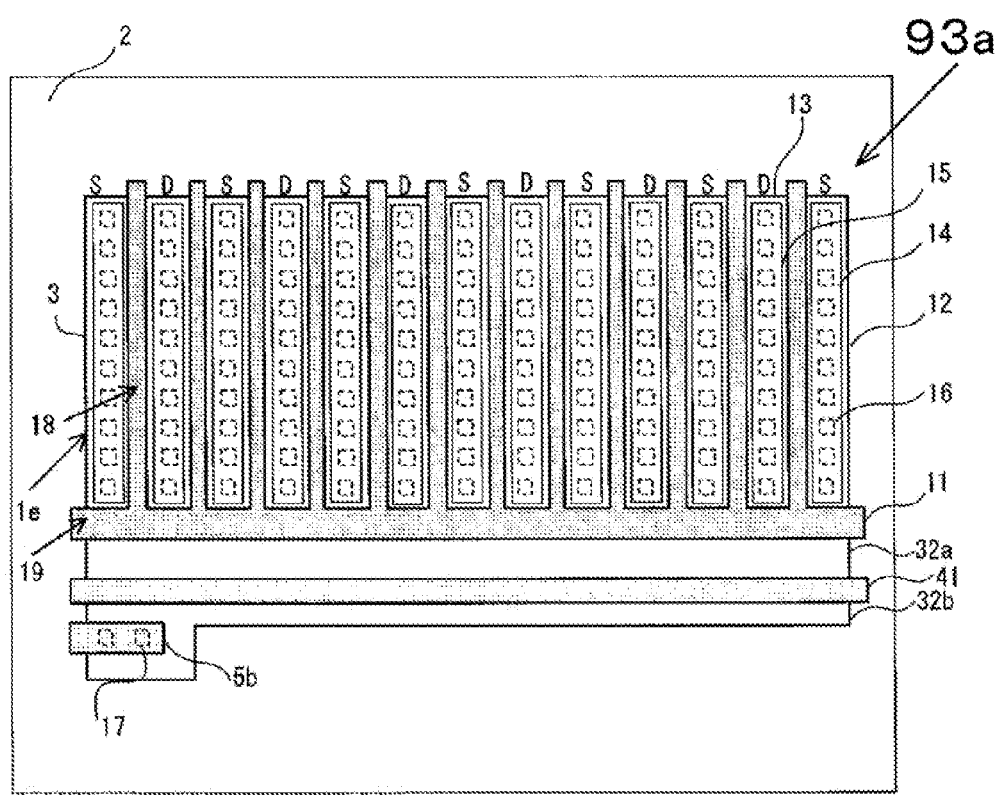
FIG. 16 is a schematic plan view showing a semiconductor device according to a third modification.

Although the body bias control electrode 5 is formed in parallel with the connection 19 to extend between the opposite ends of the device formation region 1, it is not necessarily limited to this. For example, as in a high-frequency switch FET 93a according to a third modification shown in FIG. 16, a body bias control electrode 5b may be arranged and formed in a reduced size from that of the body bias control electrode 5 in the fourth embodiment. Specifically, in parallel with the lead resistance control electrode 41, the body bias control electrode 5b is disposed at a left end portion of a device formation region 1e. By reducing the size of the body bias control electrode, the high-frequency switch IC can be made smaller.

As described above, the high-frequency switch FET 93 according to the embodiment is provided with the device formation region 1d isolated by the device isolation region (STI) 2 at the periphery. The device formation region 1d includes the SDG region 3, the body contact region 32a, the body contact region 32b, the lead resistance control electrode 41, and the body bias control electrode 5. The body contact region 32a, the body region 23, the body contact region 32b, the gate insulating film 24, and the lead resistance control electrode 41 constitute a normally-on type P-channel MOSFET structure.

Therefore, when a negative voltage to turn off is applied, the on-resistance of the normally-on type P-channel MOSFET decreases, and when a positive voltage to turn on is applied, the normally-on type P-channel MOSFET is turned into an off state. Thus, switching of body bias control when on becomes unnecessary.

Moreover, an RF signal when on can be prevented from leaking to the body bias control circuit side, thus allowing for an improvement in performance when on.

Figure 17:
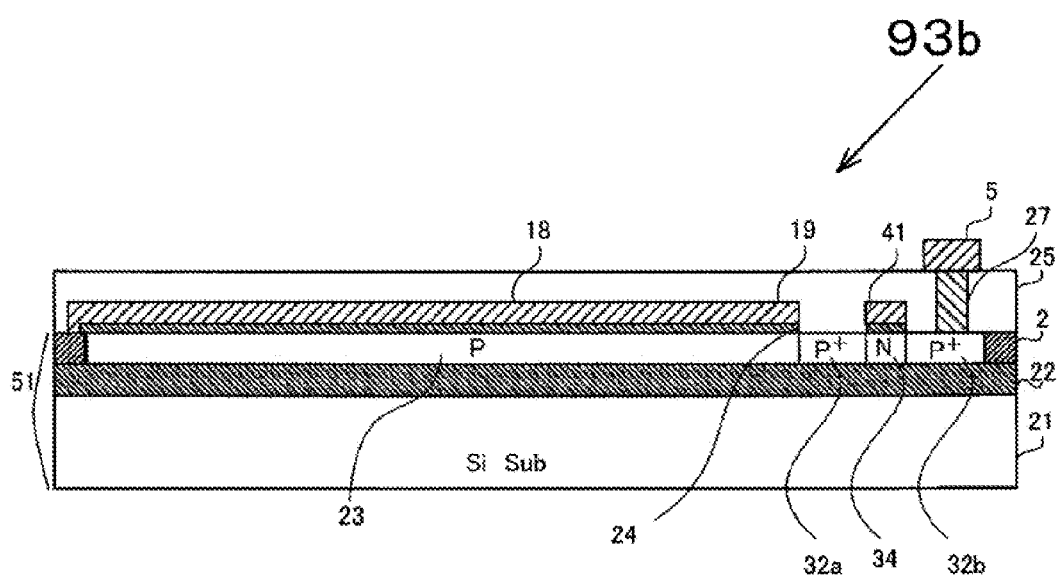
FIG. 17 is a cross-sectional view showing a semiconductor device according to a fourth modification.

Further, as in a high-frequency switch FET 93b according to a fourth modification in FIG. 17, the body region 23 (p layer) may be changed to the N layer 34. In this case, a voltage generation circuit is additionally necessary for controlling the on-resistance of an FET that controls lead resistance (in the figure, a normally-off type P-channel MOSFET including the gate insulating film 24, the lead resistance control electrode 41, the body contact region 32a, the N layer 34, and the body contact region 32b), but a control circuit for controlling the body bias control electrode 5 can be separated from the FET.

Therefore, leakage of a high-frequency signal to the control circuit side or distortion sources can be reduced more than before.

Furthermore, the gate insulating film 24 and the lead resistance control electrode 41 may be formed in layers on the N layer 34 in the second modification. In this case, it is necessary to apply to the lead resistance control electrode 41 a voltage with a characteristic opposite to that to the gate electrode 11. However, since voltages for both on and off are prepared for the high-frequency switch IC, there is no need to additionally provide a new circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a gate electrode comprising a plurality of first portions arranged in parallel with a first distance therebetween, and a second portion connecting the plurality of first portions;
   source and drain regions of a first conductivity type provided between the plurality of first portions and contacting a source electrode and a drain electrode respectively; and
   a control electrode provided in electrical contact with a body region of a second conductivity type and in parallel with the second portion at a second distance from the second portion, the second distance being greater than the first distance.

2. The semiconductor device according to claim 1, further comprising:
   an SOI substrate comprising a silicon substrate, a buried oxide film, and a region in which the source regions, the drain regions, and the body region are formed.

3. The device according to claim 2, further comprising:
   a body contact region having the same conductivity type as the body region, and by which the control electrode is in electrical contact with the body region, the body contact region having a dopant concentration higher than that of the body region.

4. The device according to claim 3, wherein
   the body contact region and the body region form a PN diode.

5. The device according to claim 1, further comprising:
a gate insulating film between the gate electrode and the body region.

6. The device according to claim 1, further comprising:
a first body contact region having the same conductivity type as the body region, and by which the control electrode is in electrical contact with the body region; and
a second body contact region having the same conductivity type as the body region disposed between first and second portions of the body region, the first portion of the body region being disposed between the first and second body contact regions and the second portion of the body region being in contact with a gate insulating film that is interposed between the second portion of the body region and the gate electrode.

7. The device according to claim 6, wherein the first and second body contact regions have a dopant concentration higher than that of the first and second portions of the body region.

8. The device according to claim 1, wherein the second distance is two or more times longer than the first distance.

9. A semiconductor device comprising:
a gate electrode comprising a plurality of first portions arranged in parallel with a first distance therebetween, and a second portion connecting the plurality of first portions;
source and drain regions provided between the plurality of first portions;
a first control electrode provided in electrical contact with a body region and in parallel with the second portion at a second distance from the second portion, the second distance being greater than the first distance; and
a second control electrode provided in electrical contact with the body region and between the gate electrode and the first control electrode.

10. The device according to claim 9, wherein lengths of the second portion and the first control electrode in a direction that is crosswise to the first portions are substantially the same.

11. The device according to claim 9, wherein a length of the first control electrode in a direction that is crosswise to the first portions is about equal to the first distance.

12. The device according to claim 9, further comprising:
a first body contact region in electrical contact with the first control electrode; and
a second body contact region that divides the body region into a first body region that is between the first and second body contact regions and a second body region in contact with a gate insulating film that is interposed between the second body region and the gate electrode.

13. The device according to claim 12, further comprising:
a gate insulating film between the second control electrode and the first body region.

14. The device according to claim 12, wherein
the first and second body contact regions have a conductivity type that is the same as that of the first and body regions.

15. The device according to claim 12, wherein
the first and second body contact regions have a conductivity type opposite to that of the first and body regions.

16. The device according to claim 9, wherein the second distance is two or more times longer than the first distance.

17. A semiconductor device comprising:
a gate electrode comprising a plurality of first portions arranged in parallel with a first distance therebetween, a second portion connecting the plurality of first portions on first ends of the first portions, and a third portion connecting the plurality of first portions on second ends of the first portions that are opposite the first ends;
source and drain regions provided between the plurality of first portions;
a first control electrode provided in electrical contact with a body region and in parallel with the second portion at a second distance from the second portion, the second distance being greater than the first distance; and
a second control electrode provided in electrical contact with the body region and in parallel with the third portion at a third distance from the third portion, the third distance being greater than the first distance.

18. The device according to claim 17, wherein the second and third portions are arranged to be parallel to each other and the second and third distances are substantially the same.

19. The device according to claim 18, wherein the second and third distances are two or more times longer than the first distance.

20. The device according to claim 17, wherein lengths of the second and third portions and the first and second control electrodes in a direction that is crosswise to the first portions are substantially the same.

* * * * *